(12) United States Patent
Chen et al.

(10) Patent No.: US 10,801,113 B2
(45) Date of Patent: Oct. 13, 2020

(54) FERROELECTRIC ELEMENT AND METHOD OF MANUFACTURING FERROELECTRIC ELEMENT

(71) Applicants: Xianfeng Chen, Aichi (JP); Melanie Meixner, Munich (DE); Christian Vedder, Munich (DE); Theodor Schneller, Aachen (DE); Ulrich Boettger, Aachen (DE)

(72) Inventors: Xianfeng Chen, Aichi (JP); Melanie Meixner, Munich (DE); Christian Vedder, Munich (DE); Theodor Schneller, Aachen (DE); Ulrich Boettger, Aachen (DE)

(73) Assignee: Ricoh Company, Ltd., Tokyo (JP)

(*) Notice: Subject to any disclaimer, the term of this patent is extended or adjusted under 35 U.S.C. 154(b) by 48 days.

(21) Appl. No.: 15/487,563

(22) Filed: Apr. 14, 2017

(65) Prior Publication Data

US 2017/0298520 A1    Oct. 19, 2017

(30) Foreign Application Priority Data

Apr. 19, 2016  (JP) ................................ 2016-083845

(51) Int. Cl.
*C23C 28/00* (2006.01)
*C23C 18/12* (2006.01)
(Continued)

(52) U.S. Cl.
CPC ............ *C23C 28/36* (2013.01); *C23C 14/028* (2013.01); *C23C 14/081* (2013.01);
(Continued)

(58) Field of Classification Search
CPC . C23C 28/36; C23C 18/1295; C23C 18/1254; C23C 18/1208; C23C 18/1291;
(Continued)

(56) References Cited

U.S. PATENT DOCUMENTS 5,555,486 A * 9/1996 Kingon .................. H01L 28/40
257/295
6,146,963 A * 11/2000 Yu ........................... H01L 28/75
438/396
(Continued)

FOREIGN PATENT DOCUMENTS

JP    S61-177785    8/1986
JP    H06-283433    10/1994
(Continued)

OTHER PUBLICATIONS

Shun-Chiu Lin et al., "Fabrication of PZT MEMS energy harvester based on silicon and stainless-steel substrates utilizing an aerosol deposition method", Journal of Micromechanics and Microengineering, vol. 23, 125028 (2013).
(Continued)

*Primary Examiner* — Nathan L Van Sell
(74) *Attorney, Agent, or Firm* — IPUSA, PLLC

(57) ABSTRACT

A method of manufacturing a ferroelectric element includes forming an insulating film on one side of a metal substrate by an electron beam (EB) vapor deposition method or a sputtering method; forming a metal film on the insulating film by the sputtering method; and forming a ferroelectric film on the metal film by a sol-gel method. The metal substrate includes iron (Fe) and nickel (Ni), and a content of the nickel (Ni) is greater than or equal to 30% and less than or equal to 40%.

14 Claims, 7 Drawing Sheets

(51) Int. Cl.

| | |
|---|---|
| *C23C 14/30* | (2006.01) |
| *H01G 4/33* | (2006.01) |
| *H01G 7/06* | (2006.01) |
| *H01G 4/12* | (2006.01) |
| *C23C 14/18* | (2006.01) |
| *C23C 14/08* | (2006.01) |
| *H01G 4/008* | (2006.01) |
| *C23C 14/02* | (2006.01) |
| *C23C 14/16* | (2006.01) |
| *C23C 14/22* | (2006.01) |
| *C23C 14/34* | (2006.01) |
| *C23C 14/58* | (2006.01) |
| *H01L 49/02* | (2006.01) |

(52) U.S. Cl.
CPC .......... *C23C 14/165* (2013.01); *C23C 14/185* (2013.01); *C23C 14/221* (2013.01); *C23C 14/30* (2013.01); *C23C 14/34* (2013.01); *C23C 14/5806* (2013.01); *C23C 18/1208* (2013.01); *C23C 18/1254* (2013.01); *C23C 18/1291* (2013.01); *C23C 18/1295* (2013.01); *C23C 28/322* (2013.01); *C23C 28/345* (2013.01); *C23C 28/3455* (2013.01); *H01G 4/008* (2013.01); *H01G 4/1245* (2013.01); *H01G 4/33* (2013.01); *H01G 7/06* (2013.01); *H01L 28/55* (2013.01); *H01L 28/65* (2013.01)

(58) Field of Classification Search
CPC . C23C 14/028; C23C 28/3455; C23C 28/322; C23C 14/165; C23C 14/185; C23C 14/081; C23C 28/345; C23C 14/5806; C23C 14/34; C23C 14/221; C23C 14/30; H01G 7/06
See application file for complete search history.

(56) References Cited

U.S. PATENT DOCUMENTS

| | | | | |
|---|---|---|---|---|
| 6,387,712 | B1 * | 5/2002 | Yano | .................. C23C 14/0026 |
| | | | | 257/E21.272 |
| 6,810,575 | B1 * | 11/2004 | Saito | ..................... B82Y 10/00 |
| | | | | 29/592.1 |
| 9,202,717 | B2 | 12/2015 | Takeuchi et al. | |
| 9,461,239 | B2 | 10/2016 | Chen | |
| 9,583,270 | B2 | 2/2017 | Akiyama et al. | |
| 9,583,694 | B2 | 2/2017 | Chen | |
| 2004/0164293 | A1 * | 8/2004 | Maloney | ............... G03F 7/0042 |
| | | | | 257/40 |
| 2006/0118840 | A1 * | 6/2006 | Ezhilvalavan | .......... H01G 7/06 |
| | | | | 257/295 |
| 2007/0138906 | A1 | 6/2007 | Tsukamoto | |
| 2009/0110915 | A1 * | 4/2009 | Findikoglu | .......... C23C 14/024 |
| | | | | 428/336 |
| 2014/0240893 | A1 * | 8/2014 | Capanu | .................... H01G 7/06 |
| | | | | 361/280 |
| 2016/0023466 | A1 | 1/2016 | Chen | |
| 2017/0092836 | A1 | 3/2017 | Chen | |

FOREIGN PATENT DOCUMENTS

| | | |
|---|---|---|
| JP | H09-102587 | 4/1997 |
| JP | 2007-173400 | 7/2007 |
| JP | 2010-118447 | 5/2010 |
| JP | 2011-236113 | 11/2011 |
| JP | 2014-154581 | 8/2014 |

OTHER PUBLICATIONS

U.S. Appl. No. 15/290,092, filed Oct. 11, 2016.
Japanese Office Action for 2016-083845 dated Dec. 3, 2019.

\* cited by examiner

FERROELECTRIC ELEMENT AND METHOD OF MANUFACTURING FERROELECTRIC ELEMENT

CROSS-REFERENCE TO RELATED APPLICATION

The present application claims priority under 35 U.S.C. § 119 to Japanese Patent Application No. 2016-083845, filed on Apr. 19, 2016, the contents of which are incorporated herein by reference in their entirety.

BACKGROUND OF THE INVENTION

1. Field of the Invention

The present invention relates to a ferroelectric element and a method of manufacturing a ferroelectric element.

2. Description of the Related Art

Ferroelectric elements are garnering interest as a material that can be used for a wide range of purposes, such as a ferroelectric memory device, a sensor, and an actuator, etc. Among these, the material that is most widely used is a lead zirconate zirconium titanate (PZT). Presently, a ferroelectric film, which forms the ferroelectric element, is formed on a silicon substrate. However, there is demand for other structures that can be applied to an embedded type capacitor device or a flexible wearable device.

Non-patent Document 1: J. Micromech. Microeng., 23, 125028(2013)

SUMMARY OF THE INVENTION

An aspect of the present invention provides a ferroelectric element and a method of manufacturing a ferroelectric element in which one or more of the disadvantages of the related art are reduced.

According to one aspect of the present invention, there is provided a method of manufacturing a ferroelectric element, the method including forming an insulating film on one side of a metal substrate by an electron beam (EB) vapor deposition method or a sputtering method; forming a metal film on the insulating film by the sputtering method; and forming a ferroelectric film on the metal film by a sol-gel method, wherein the metal substrate includes iron (Fe) and nickel (Ni), and a content of the nickel (Ni) is greater than or equal to 30% and less than or equal to 40%.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
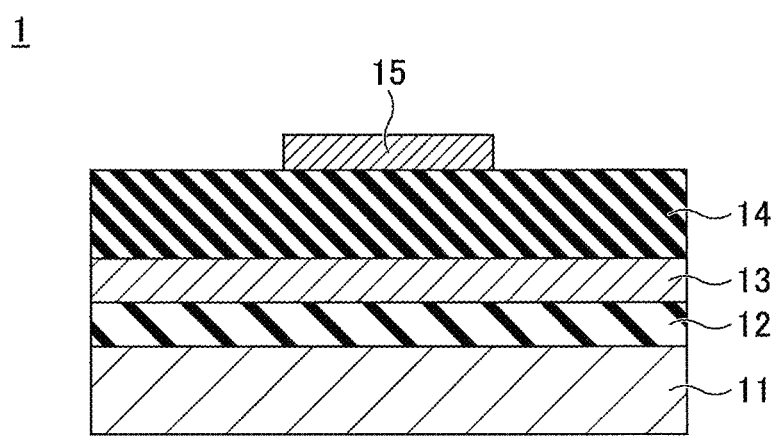
FIG. 1 is a cross-sectional view of an example of a ferroelectric element according to a first embodiment of the present invention.

In the related art, a ferroelectric film is formed on a metal substrate to form a ferroelectric element, and this technique has been reported in several literary documents. However, it has been difficult to specifically commercialize this technique. The main reason why it is difficult to commercialize this technique is as follows. When fabricating a ferroelectric film that includes an element that evaporates easily (for example, lead (Pb)), particularly a PZT, and that requires heat treatment in an oxygen atmosphere, the following problems arise. That is, the sample bends and the overall flatness of the sample becomes degraded, and the metal substrate becomes oxidized (see, for example, Non-patent Document 1).

When the flatness becomes degraded, it is not possible to execute a precise process when forming a film on the ferroelectric element. When the metal substrate becomes oxidized, the properties of the ferroelectric film deteriorate.

A problem to be solved by an embodiment of the present invention is to provide a ferroelectric element having both flatness and favorable properties, and a method of manufacturing the ferroelectric element.

Embodiments of the present invention will be described by referring to the accompanying drawings. Note that in the drawings, the same elements are denoted by the same reference numerals, and overlapping descriptions may be omitted.

First Embodiment

FIG. 1 is a cross-sectional view of an example of a ferroelectric element according to a first embodiment. Referring to FIG. 1, a ferroelectric element 1 according to the first embodiment includes a metal substrate 11, an insulating film 12, a metal film 13, a ferroelectric film 14, and an upper electrode 15.

The thickness of the metal substrate 11 is, for example, preferably greater than or equal to 10 μm and less than or equal to 100 μm. By making the thickness of the metal substrate 11 to be less than or equal to 100 μm, the flexible ferroelectric element 1 can be realized.

The metal substrate 11 is preferably a substrate including one or more metals of iron (Fe), nickel (Ni), cobalt (Co), platinum (Pt), and palladium (Pd). Particularly, the metal substrate 11 preferably includes Fe and Ni, and the content of Ni is preferably greater than or equal to 30% and less than or equal to 40%. Furthermore, the thermal expansion rate of the metal substrate 11 at room temperature is preferably less than or equal to $5 \times 10^{-6}$/K.

In the present embodiment, the material used as the metal substrate 11 has a thermal expansion rate at room temperature that is less than or equal to 50% of the thermal expansion rate of the ferroelectric film 14 at room temperature. Here, room temperature means 27° C.±10° C. (the same applies hereinafter).

For example, when a PZT crystal film is used as the ferroelectric film 14, as the metal substrate 11, it is possible to use an invar that is an alloy obtained by adding approximately 36% of Ni to Fe (hereinafter, an invar of Ni36%-Fe). Furthermore, as the metal substrate 11, it is possible to use a super invar that is an alloy obtained by adding approximately 31% of Ni and approximately 5% of Co to Fe (hereinafter, an invar of Ni31%-Co5%-Fe). However, the metal substrate 11 is not so limited.

The thermal expansion rate of the PZT crystal film at room temperature is approximately $9 \times 10^{-6}$/K. Furthermore, the thermal expansion rate of invar of Ni36%-Fe at room temperature is approximately $1 \times 10^{-6}$/K. Furthermore, the thermal expansion rate of invar of Ni31%-Co5%-Fe at room temperature is approximately $0.1 \times 10^{-6}$/K.

Note that a PZT is a solid solution of lead zirconate ($PbZrO_3$) and lead titanate ($PbTiO_3$). The properties of a PZT change according to the ratio of $PbZrO_3$ and $PbTiO_3$. For example, it is possible to use a PZT in which the ratio of $PbZrO_3$ and $PbTiO_3$ is 53:47, and that is expressed by a chemical formula of $Pb(Zr_{0.53},Ti_{0.47})O_3$, generally expressed as PZT(53/47).

One side of the metal substrate 11 is polished (mirror polish) to have a surface roughness Rz of less than or equal to 0.5 μm (for example, approximately Rz=0.08 μm). On the polished side, the insulating film 12, the metal film 13, the ferroelectric film 14, and the upper electrode 15 are sequentially deposited. Note that in addition to one side of the metal substrate 11, the other side (back side) may also be polished. That is, as the metal substrate 11, a substrate having one side polished may be used, or a substrate having both sides polished may be used.

The material of the insulating film 12 is not particularly limited, as long as the metal substrate 11 and the metal film 13 can be insulated. As the material of the insulating film 12, for example, an alumina film ($Al_2O_3$ film), a silicon nitride film ($Si_3N_4$ film), a silicon oxide film ($SiO_2$ film), etc., may be used. Alternatively, an insulating film including the elements of Ti, Zr, Cr, Mg, Al, and Si may be used. The film thickness of the insulating film 12 is not particularly limited; for example, the film thickness of the insulating film 12 may be approximately 10 nm through 2000 nm.

The metal film 13 is a part that functions as a lower electrode. The material of the metal film 13 is not particularly limited; for example, a metal film including one or more metals of platinum (Pt), palladium (Pd), iridium (Ir), titanium (Ti), and rhodium (Rh) may be used. Furthermore, a metal alloy film including an alloy of one or more of the above metals, or a layered film formed by selecting any of the above metal films or the above metal alloy films and depositing a plurality of the selected films, etc., may be used. The film thickness of the metal film 13 (the total thickness in the case of a layered film) is preferably greater than or equal to 100 nm and less than or equal to 500 nm.

Here, the reason why the film thickness of the metal film 13 is to be greater than or equal to 100 nm is that, if the film thickness of the metal film 13 is less than 100 nm, a high leakage current may arise as described below. Furthermore, the reason why the film thickness of the metal film 13 is to be less than or equal to 500 nm is that, even if the metal film 13 is made to be thicker than 500 nm, it is not possible to attain an effect of further suppressing the leakage current, and rather, a negative effect of a cost increase will arise.

As the ferroelectric film 14, a ferroelectric film including Pb may be used, or a ferroelectric film that does not include Pb may be used. As the ferroelectric film 14, an $ABO_3$ type material may be used. An $ABO_3$ type material is described by a general formula $ABO_3$, and is a composite oxide including principal elements of A=Pb, Ba, Sr B=Ti, Zr, Sn, Ni, Zn, Mg, and Nb. As an $ABO_3$ type material, for example, the PZT described above and barium titanate may be used.

The material of the upper electrode 15 is not particularly limited; for example, the above examples of the materials of the metal film 13 may be used. The film thickness of the upper electrode 15 is not particularly limited; for example, the film thickness may be approximately 100 nm through 300 nm.

Next, a description is given of a method of manufacturing the ferroelectric element 1. FIGS. 2A through 2E illustrate an example of the processes of manufacturing the ferroelectric element 1 according to the first embodiment.

Figure 2A:
FIGS. 2A through 2E illustrate an example of the processes of manufacturing the ferroelectric element according to the first embodiment of the present invention.

First, in the process illustrated in FIG. 2A, the metal substrate 11 to be the support is prepared, and one side of the metal substrate 11 is polished (mirror polishing). The polishing may be done by hub polishing, etc. The surface roughness of the metal substrate 11 before polishing is, for example, approximately Rz=0.06 μm. The surface roughness Rz of the metal substrate 11 after polishing is, for example, less than or equal to 0.5 μm (for example, approximately Rz=0.08 μm). After polishing, the surface of the metal substrate 11 is preferably subjected to ultrasonic cleaning with the use of acetone, etc. Note that as the metal substrate 11, a substrate having a thermal expansion rate at room temperature that is less than or equal to 50% of the thermal expansion rate of the ferroelectric film 14 at room temperature, which is formed in a subsequent process, is used. The specific examples of the material and the thickness of the metal substrate 11 are as described above.

After the polishing process, for example, by an electron beam (EB) vapor deposition method, on one side of the metal substrate 11 (the polished side), the insulating film 12 is formed under the temperature condition of less than or equal to 300° C. (for example, at room temperature). The materials and the film thickness of the insulating film 12 are as described above.

Figure 2B:
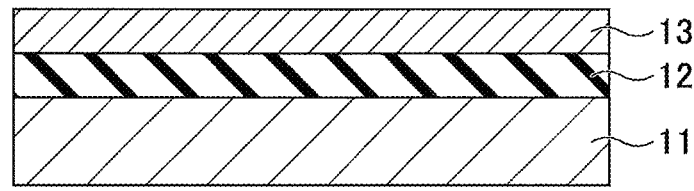

Next, in the process illustrated in FIG. 2B, for example, by a sputtering method, on the insulating film 12, the metal film 13 is formed under the temperature condition of less than or equal to 300° C. (for example, at 150° C.). The materials and the film thickness of the metal film 13 are as described above.

As described above, by performing the process of vapor depositing the insulating film 12 and the process of depositing the metal film 13 under a temperature condition of less than or equal to 300° C., it is possible to prevent the metal substrate 11 from being oxidized. As a result, the composition (for example, Ni and Fe, etc.) of the metal substrate 11 can be prevented from being diffused to the surface of the metal film 13. Furthermore, the alumina film ($Al_2O_3$ film), etc., forming the insulating film 12 has high adhesion with respect to the metal substrate 11 and the metal film 13, and therefore the metal film 13 can be prevented from separating from the insulating film 12 during the process of forming the metal film 13.

Note that when the metal substrate 11 becomes oxidized and the composition of the metal substrate 11 diffuses to the surface of the metal film 13, as indicated in comparison example 1 described below, the insulating film 12 may become detached, and finally, the properties of the ferroelectric element 1 may be degraded.

Next, a structure body including the metal substrate 11, the insulating film 12, and the metal film 13 is subjected to heat treatment at a temperature higher than 300° C. (for example, a temperature higher than 300° C. and lower than 500° C.), by a hot plate, etc. This heating process is not an essential process; however, by performing a heating process, it is possible to form the metal film 13 having high crystallinity. By forming the metal film 13 having high crystallinity, in a subsequent process, it is possible to form the ferroelectric film 14 having high crystallinity on the metal film 13.

Note that after depositing the insulating film 12 and the metal film 13 on the metal substrate 11, even if a structure body including the metal substrate 11, the insulating film 12, and the metal film 13 is subjected to heat treatment at a temperature higher than 300° C., the problem of the oxidization of the metal substrate 11 will not occur. This is because the films, which are formed on the metal substrate 11, block oxygen from entering the metal substrate 11 from the surface.

Figure 2C:
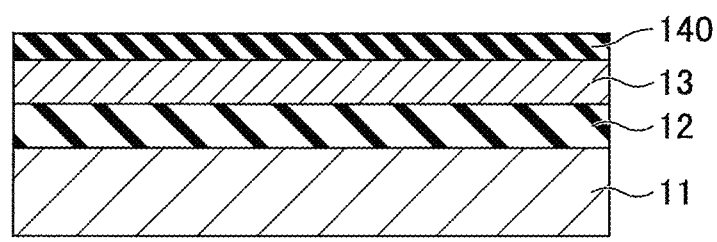

Next, in the process of FIG. 2C, a ferroelectric film 140 is formed on the metal film 13 by a sol-gel method. A plurality of the ferroelectric films 140 are deposited to increase the film thickness and form the ferroelectric film 14. The ferroelectric film 140 is preferably formed in an atmosphere including oxygen. This is to reduce the oxygen deficiency in the ferroelectric film 140.

When forming a PZT film as the ferroelectric film 140, for example, a lead acetate, a zirconium alkoxide, and a titanium alkoxide compound, which are starting materials, are dissolved in methoxyethanol that is a common solvent, and a PZT precursor solution (PZT sol-gel liquid) that is a uniform solvent, is synthesized. Then, for example, by a spin coating method, the PZT precursor solution is applied on the metal film 13, to form a PZT coated film. Note that the composite oxide solid component concentration of the synthesized PZT precursor solution may be, for example, approximately less than or equal to 0.5 mole/liter.

Next, the metal substrate 11 on which the insulating film 12, the metal film 13, and the PZT coated film are formed, is placed on, for example, a hot plate (not illustrated), and is heated, for example, to approximately 220° C. Accordingly, the solvent evaporates, and the PZT coated film is thermally decomposed and becomes a solid PZT amorphous film (an amorphous oxide film). Next, the PZT amorphous film is subjected to heat treatment for approximately three minutes at a temperature of 600° C. through 700° C. by an electric furnace and a Rapid Thermal Annealing (RTA) device, etc. Accordingly, the PZT amorphous film becomes a PZT crystal film that is the ferroelectric film 140. Note that the film thickness of the ferroelectric film 140 that can be formed by one process is approximately 30 nm through 80 nm.

Figure 2D:
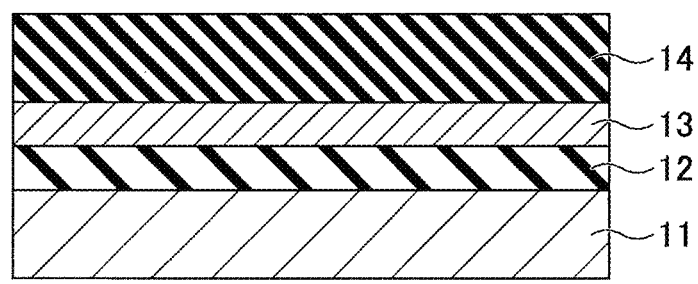

Next, in the process illustrated in FIG. 2D, the process illustrated in FIG. 2C is repeated to sequentially deposit the ferroelectric films 140 having a film thickness of approximately 30 nm through 80 nm to increase the thickness, and form the ferroelectric film 14 (for example, a PZT crystal film) having a desired film thickness. The film thickness of the ferroelectric film 14 may be, for example, approximately 600 nm.

Figure 2E:
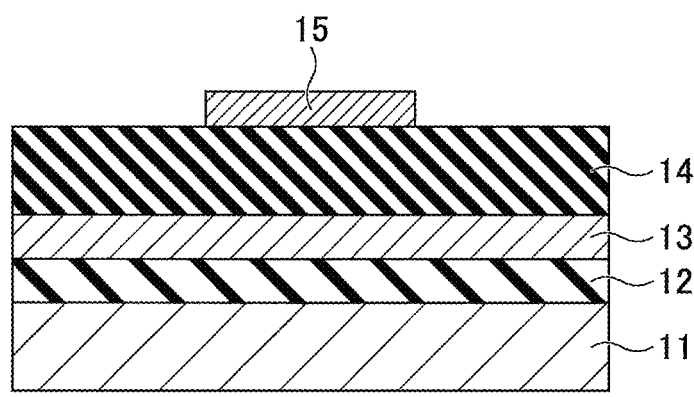

Next, in the process illustrated in FIG. 2E, a platinum film (Pt film), etc., which has a film thickness of approximately 200 nm and which has a predetermined electrode pattern, is deposited as the upper electrode 15 on the ferroelectric film 14. The upper electrode 15 may be formed into a predetermined electrode pattern, for example, by a sputtering method by using a metal mask. By the above processes, the ferroelectric element 1 illustrated in FIG. 1 is completed.

As described above, in the ferroelectric element 1, the metal substrate 11 is formed by using a material having a thermal expansion rate at room temperature that is less than or equal to 50% of the thermal expansion rate of the ferroelectric film 14 at room temperature. Accordingly, the expansion and contraction of the metal substrate 11 can be suppressed during the manufacturing processes. Therefore, the fabricated ferroelectric element 1 has a favorable flatness, with hardly any bends, and favorable electric properties (for example, a polarization vs. electric field (P-E) curve). Note that because the flatness of the surface of the metal substrate 11 is favorable, the surfaces of the films deposited on the metal substrate 11 will also have a favorable flatness.

Furthermore, by making the film thickness of the metal substrate 11 to be less than or equal to 100 μm, the flexible ferroelectric element 1 can be realized. The flexible ferroelectric element 1, which has a favorable flatness and favorable electric properties, may be applied to a wide range of products such as a sensor, a capacitor, an actuator, and an energy harvest, etc. In this case, wirings are pulled out from the metal film 13 to become a lower electrode and the upper electrode 15, and are coupled to an external circuit.

MODIFICATION EXAMPLE 1 OF FIRST EMBODIMENT

Figure 3:
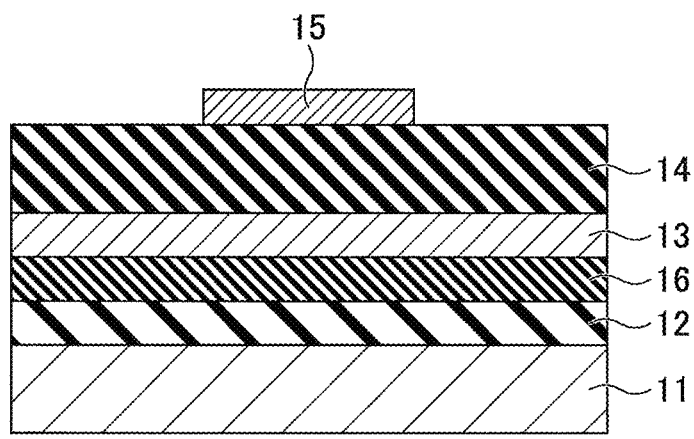
FIG. 3 is a cross-sectional view of a ferroelectric element according to a modification example 1 of the first embodiment of the present invention.

FIG. 3 is a cross-sectional view of a ferroelectric element according to a modification example 1 of the first embodiment. Referring to FIG. 3, a ferroelectric element 2 according to the modification example 1 of the first embodiment is different from the ferroelectric element 1 (see FIG. 1), in that an insulating film 16 is added between the insulating film 12 and the metal film 13. That is, the insulating film, which is formed on the metal substrate 11, has a layered structure including the insulating film 12 and the insulating film 16.

As the insulating film 12 and the insulating film 16, for example, an alumina film ($Al_2O_3$ film), a silicon nitride film ($Si_3N_4$ film), a silicon oxide film ($SiO_2$ film), etc., may be combined according to need. The film thickness of the insulating film 12 is preferably approximately 100 nm, and the film thickness of the insulating film 16 is preferably approximately 150 nm.

In order to form the insulating films 12 and 16, first, the insulating film 12 is formed on one side of the metal substrate 11 by a sputtering method, etc., and then the insulating film 16 is to be formed on the insulating film 12 by a sputtering method, etc. The insulating films 12 and 16 are preferably formed under a temperature condition of less than or equal to 300° C. (for example, at room temperature). In the ferroelectric element 2, other manufacturing processes are the same as the processes illustrated in FIGS. 2A through 2E.

As described above, by using a layered structure, which includes the insulating film 12 and the insulating film 16, as the insulating film formed on the metal substrate 11, it is possible to adjust the stress inside the ferroelectric element 2 by selecting the materials and film thicknesses of the respective layers, and therefore a ferroelectric element having an even more favorable flatness can be fabricated. The other effects are the same as those of the first embodiment.

MODIFICATION EXAMPLE 2 OF FIRST EMBODIMENT

Figure 4:
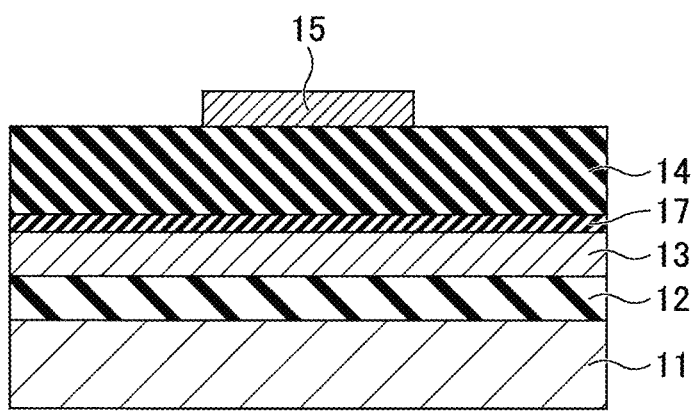
FIG. 4 is a cross-sectional view of a ferroelectric element according to a modification example 2 of the first embodiment of the present invention.

FIG. 4 is a cross-sectional view of a ferroelectric element according to a modification example 2 of the first embodiment. Referring to FIG. 4, a ferroelectric element 3 according to the modification example 2 of the first embodiment is different from the ferroelectric element 1 (see FIG. 1), in that a seed film 17 is added between the metal film 13 and the ferroelectric film 14.

As the seed film 17, for example, a $SrRuO_3$ film having a film thickness of approximately 50 nm may be used. The seed film 17 may be formed by, for example, a sputtering method, etc. The other manufacturing process of the ferroelectric element 3 are the same as those illustrated in FIGS. 2A through 2E.

As described above, by using a $SrRuO_3$ film as the seed film 17, it is possible to fabricate a PZT crystal film having a (111) orientation, as the ferroelectric film 14, on the seed film 17. The other effects are the same as those of the first embodiment. Note that in this case, the layered structure, which includes the $SrRuO_3$ film and the PZT crystal film, functions as a ferroelectric film.

The seed film 17 is not limited to a $SrRuO_3$ film, and according to the requested orientation, it is possible to use another seed film, such as a film of, for example, $IrO_2$, $LaNiO_3$, and $PbTiO_3$, etc. Note that when the seed film 17 is not provided, the ferroelectric film 14 will have a random orientation.

Second Embodiment

Figure 5:
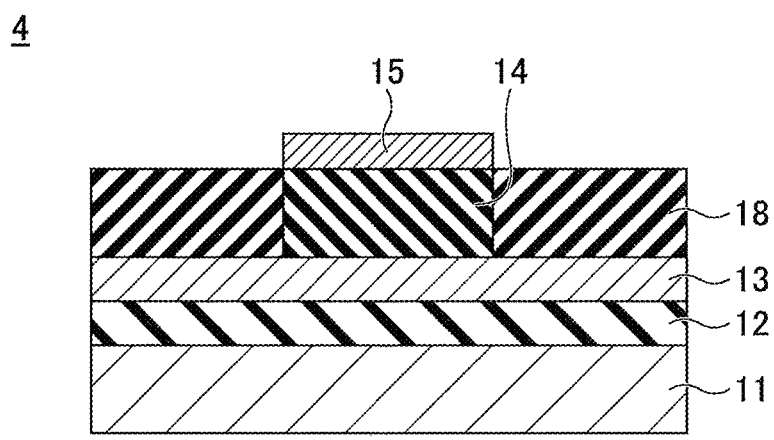
FIG. 5 is a cross-sectional view of an example of a ferroelectric element according to a second embodiment of the present invention.

FIG. 5 is a cross-sectional view of an example of a ferroelectric element according to a second embodiment. Referring to FIG. 5, a ferroelectric element 4 according to the second embodiment is different from the ferroelectric element 1 (see FIG. 1) in that the ferroelectric film 14 is partially formed on the metal film 13, and a PZT amorphous film 18 is formed around the ferroelectric film 14.

Figure 6A:
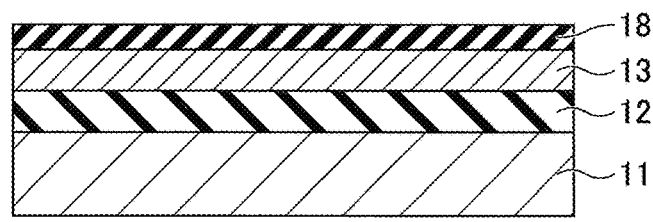
FIGS. 6A through 6C illustrate an example of the processes of manufacturing the ferroelectric element according to the second embodiment of the present invention.
Figure 6B:
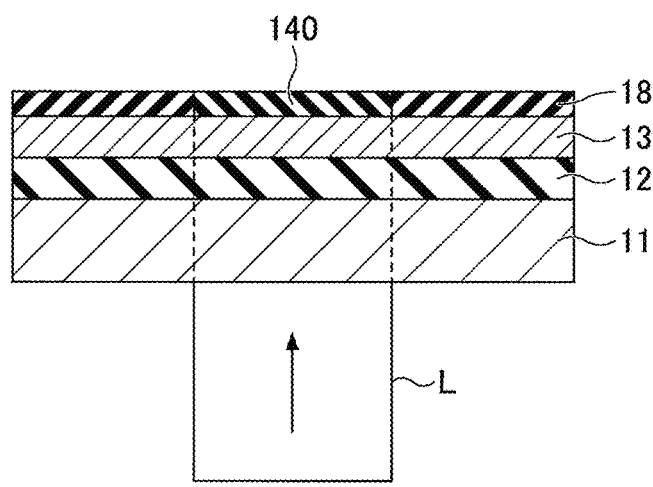
Figure 6C:
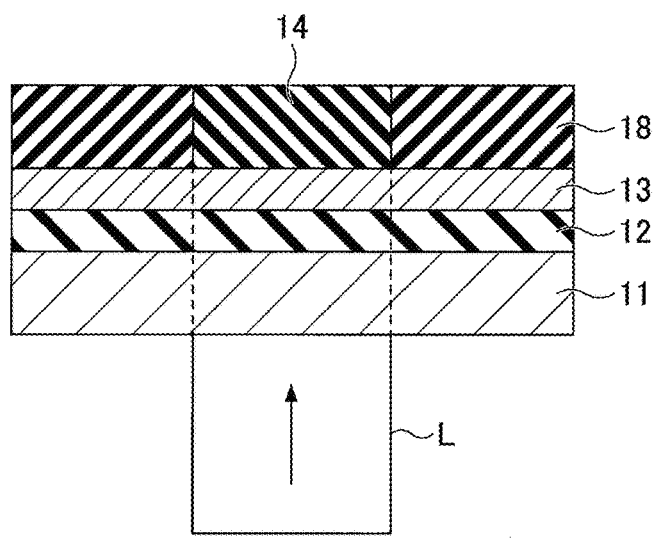

FIGS. 6A through 6C illustrate an example of the processes of manufacturing the ferroelectric element 4 according to the second embodiment. First, the same processes as those of FIGS. 2A and 2B are executed. Subsequently, in the process illustrated in FIG. 6A, the PZT amorphous film 18 is formed on the metal film 13 in an atmosphere including oxygen.

Specifically, similar to the process illustrated in FIG. 2C, a PZT precursor solution (PZT sol-gel liquid) is synthesized, and for example, by a spin coating method, the PZT precursor solution is applied on the metal film 13, to form a PZT coated film. Note that the composite oxide solid component concentration of the synthesized PZT precursor solution may be, for example, approximately less than or equal to 0.5 mole/liter.

Next, the metal substrate 11 on which the insulating film 12, the metal film 13, and the PZT coated film are formed, is placed on, for example, a hot plate (not illustrated), and is heated, for example, to approximately 220° C. Accordingly, the solvent evaporates, and the PZT coated film is thermally decomposed and becomes the solid PZT amorphous film (an amorphous oxide film).

Next, in the process illustrated in FIG. 6B, the metal substrate 11 is partially heated by laser radiation, to locally heat the PZT amorphous film 18 (perform a laser annealing process), and form a PZT crystal film that is the ferroelectric film 140. Specifically, for example, the structure body illustrated in FIG. 6A is placed on a stage. Then, and while moving the stage, the PZT amorphous film 18 is locally irradiated with a laser beam L (for example, near a wavelength of 980 nm), which has a flat top and which is continuously oscillated, from a semiconductor laser, to crystallize the PZT amorphous film 18. Note that the areas of the PZT amorphous film 18 that are not irradiated with the laser beam L remains to be the PZT amorphous film 18. Furthermore, the film thickness of the ferroelectric film 140 that can be formed by one process, is approximately 30 nm through 80 nm.

The beam shape of the laser beam L emitted to the metal substrate 11 may be, for example, a substantially rectangular shape. The beam size of the laser beam L may be, for example, 1 mm×0.35 mm. The energy density of the laser beam L may be, for example, approximately 10 $W/cm^2$ through $1×10^6$ $W/cm^2$. The radiation time of the laser beam L may be, for example, approximately 1 milliseconds (ms) through 1 second (s).

For example, when the metal substrate 11 is an invar of Ni36%-Fe, the absorption coefficient near a wavelength of 980 nm is significantly high, at approximately $1×10^6$ $cm^{-1}$. Therefore, the laser beam L that has entered the metal substrate 11 is absorbed into an area having a depth of less than or equal to 10 nm, and changes into heat. The heat is diffused toward the PZT amorphous film 18, and heats the film that has been thermally decomposed to crystalize the film. Here, the thickness of the metal substrate 11 is less than or equal to 100 μm (for example, approximately 50 μm), but the film thickness of the insulating film 12 is only approximately 30 nm, and therefore the heat, which is diffused from the back side to the front side of each layer, can reach the front side with a small amount of loss.

Next, in the process illustrated in FIG. 6C, the process illustrated in FIG. 6B is repeated to sequentially deposit the ferroelectric films 140 having a film thickness of approximately 30 nm through 80 nm to increase the thickness, and form the ferroelectric film 14 (here, a PZT crystal film) having a desired film thickness. The film thickness of the ferroelectric film 14 may be, for example, approximately 600 nm. Note that the areas that are not irradiated with the laser beam L remain to be the PZT amorphous film 18.

When the metal substrate 11 is an invar of Ni36%-Fe, the thermal expansion rate of the metal substrate 11 at room temperature is only approximately $1×10^{-6}$/K, and therefore even when the metal substrate 11 is locally heated by using a laser beam, it is possible to attain a ferroelectric element having a favorable flatness. Furthermore, by using a local heating method, the film can by crystalized by low power consumption, which leads to a reduction in cost. Furthermore, it is favorable in that the crystal pattern can be directly formed by controlling light. Furthermore, by local heating, the film can be crystalized without affecting other elements, and therefore the ferroelectric element can be easily integrated with another element.

Note that in the present embodiment, a description is given of an example of using a continuously oscillated laser beam; however, a pulse oscillation laser beam may be used. Furthermore, instead of a laser beam near a wavelength of 980 nm, a laser beam of another wavelength may be used. Furthermore, instead of a semiconductor laser, another laser having a different laser medium may be used.

Furthermore, as the light source used for local heating, instead of a laser beam, for example, an electromagnetic wave such as an infrared ray and a microwave, etc., may be used. The light source used for local heating does not need to emit light toward the back side of the metal substrate 11; the light source may emit light toward the side of the ferroelectric film 14.

Furthermore, in the present embodiment, a description is given of a case where the ferroelectric film 14 is PZT; however, the ferroelectric film 14 may be a material (barium titanate, etc.) other than the material exemplified in the first embodiment.

EXAMPLE 1

In example 1, the ferroelectric element 1 illustrated in FIG. 1 was fabricated. Specifically, as the metal substrate 11, metal foil of invar of Ni36%-Fe having a film thickness of approximately 50 μm was prepared, and one side of the metal substrate 11 was polished (mirror polishing). The surface roughness of the metal substrate 11 before polishing was approximately Rz=0.6 μm. The surface roughness Rz of the metal substrate 11 after polishing was Rz=0.08 μm. After polishing, the surface of the metal substrate 11 was subjected to ultrasonic cleaning with the use of acetone. After ultrasonic cleaning, by an EB vapor deposition method at room temperature, on one side of the metal substrate 11 (the polished side), an alumina film ($Al_2O_3$ film) having a film thickness of approximately 30 nm was formed as the insulating film 12 (see FIG. 2A).

Next, by a sputtering method under the temperature condition of less than or equal to 150° C., on the insulating film 12, a platinum film (Pt film) having a film thickness of approximately 200 nm was deposited as the metal film 13. Then, a structure body, in which the insulating film 12 and the metal film 13 are sequentially deposited on the metal substrate 11, was subjected to heat treatment at a temperature higher than 300° C. and lower than 500° C., by a hot plate (see FIG. 2B).

Next, as described by referring to FIG. 2C, a PZT precursor solution (PZT sol-gel liquid) was synthesized, and by a spin coating method, the PZT precursor solution was applied on the metal film 13 to form a PZT coated film. Then, the metal substrate 11 on which the insulating film 12, the metal film 13, and the PZT coated film are formed, was placed on a hot plate, and was heated to approximately 220° C. Accordingly, the solvent was evaporated, and the PZT coated film was thermally decomposed to form a solid PZT amorphous film. Next, the PZT amorphous film was subjected to heat treatment for approximately three minutes at a temperature of 600° C. through 700° C. by a RTA device. Accordingly, the PZT amorphous film became a PZT crystal film that is the ferroelectric film 140 (see FIG. 2C).

Next, the above process was repeated to sequentially deposit the ferroelectric films 140 to increase the thickness, and form the ferroelectric film 14 (see FIG. 2D). Next, a platinum film (Pt film), which has a film thickness of approximately 200 nm and which has a predetermined electrode pattern, was deposited as the upper electrode 15 on the ferroelectric film 14, by a sputtering method using a metal mask. By the above processes, the ferroelectric element 1 illustrated in FIG. 1 was completed.

In the ferroelectric element 1, the thermal expansion rate of the metal substrate 11 (invar of Ni36%-Fe) at room temperature was approximately $1 \times 10^{-6}$/K. On the other hand, the thermal expansion rate of the ferroelectric film 14 (PZT crystal film) at room temperature was approximately $9 \times 10^{-6}$/K. That is, the thermal expansion rate of the metal substrate 11 (invar of Ni36%-Fe) at room temperature was approximately 11% of the thermal expansion rate of the ferroelectric film 14 (PZT crystal film) at room temperature. Therefore, these values sufficiently satisfy the condition described in the first embodiment that "the thermal expansion rate of the metal substrate 11 at room temperature is less than or equal to 50% of the thermal expansion rate of the ferroelectric film 14 at room temperature".

Figure 7:
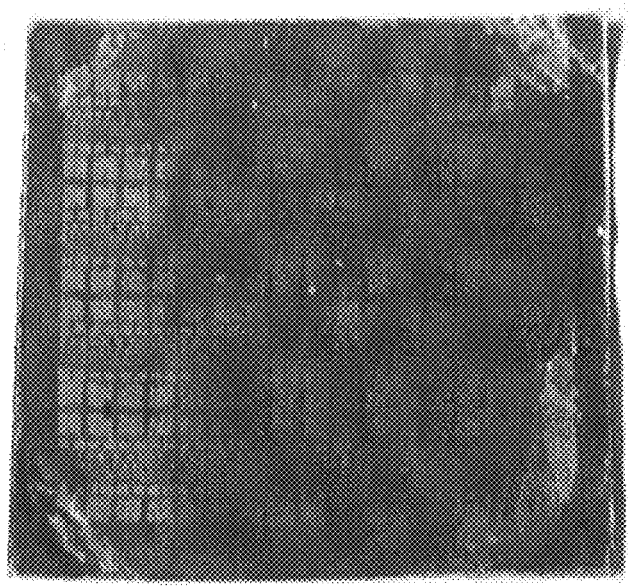
FIG. 7 is a photograph of the external view of a ferroelectric element fabricated by the example 1 according to an embodiment of the present invention.
Figure 8:
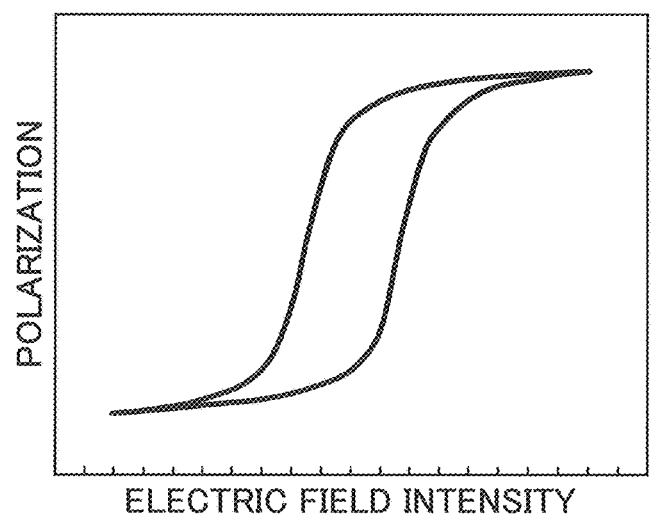
FIG. 8 is a graph indicating a polarization vs. electric field (P-E) hysteresis curve of the ferroelectric element fabricated by the example 1 according to an embodiment of the present invention.

Accordingly, the expansion and contraction of the metal substrate 11 can be suppressed during the manufacturing processes. Therefore, the fabricated ferroelectric element 1 had flatness with hardly any bends as illustrated in FIG. 7, and had a favorable P-E curve as illustrated in FIG. 8. Note that according to studies by the inventors, it has been confirmed that, if the thermal expansion rate of the metal substrate 11 at room temperature is less than or equal to 50% of the thermal expansion rate of the ferroelectric film 14 at room temperature, the fabricated ferroelectric element will have flatness with hardly any bends, and will have a favorable P-E curve, similar to the above.

COMPARISON EXAMPLE 1

In comparison example 1, in the ferroelectric element 1 according to example 1, a titanium oxide film ($TiO_X$ film) was used as the insulating film 12. The titanium oxide film was obtained by performing an oxidation process at 700° C. on a titanium film (Ti film), which has been vapor deposited by a sputtering method under the temperature condition of 150° C.

On the surface of the ferroelectric element fabricated as above, a large granulated structure was seen, and there were portions where the film has become detached. This is because when performing the oxidation process at 700° C. on the Ti film, the metal substrate 11 is also oxidized together with the Ti film. The Ni or Fe in the metal substrate 11 gather toward the surface of the metal film due to a diffusion effect, and form large oxide particles. It is considered that the presence of this granulated structure destroyed the adhesion of the titanium oxide film ($TiO_X$ film), which is a partial insulating film, and caused the film to become detached.

COMPARISON EXAMPLE 2

In comparison example 2, in the ferroelectric element 1 according to example 1, a platinum film (Pt film) having a film thickness of 50 nm was used as the metal film 13. In this case, the leakage current was high between the upper electrode and the lower electrode, and it was not possible to evaluate the P-E curve.

When the film thickness of the platinum film that is the metal film 13 is less than the surface roughness of the metal substrate 11 after the polishing process, it is not possible for the metal film 13 to cover the entire metal substrate 11 such that the surface roughness of the metal substrate 11 is not exposed. Therefore, it has been considered that the ferroelectric film 14 was formed via the insulating film 12 on the metal substrate 11 at parts that are exposed from the metal film 13, and caused a high leakage current.

COMPARISON EXAMPLE 3

In comparison example 3, in the ferroelectric element 1 according to example 1, as the metal substrate 11, a SUS430 (thermal expansion rate at room temperature: approximately $10.5 \times 10^{-6}$/K) having a thermal expansion rate near the thermal expansion rate of PZT (thermal expansion rate at room temperature: approximately $9 \times 10^{-6}$/K), was used.

Figure 9:
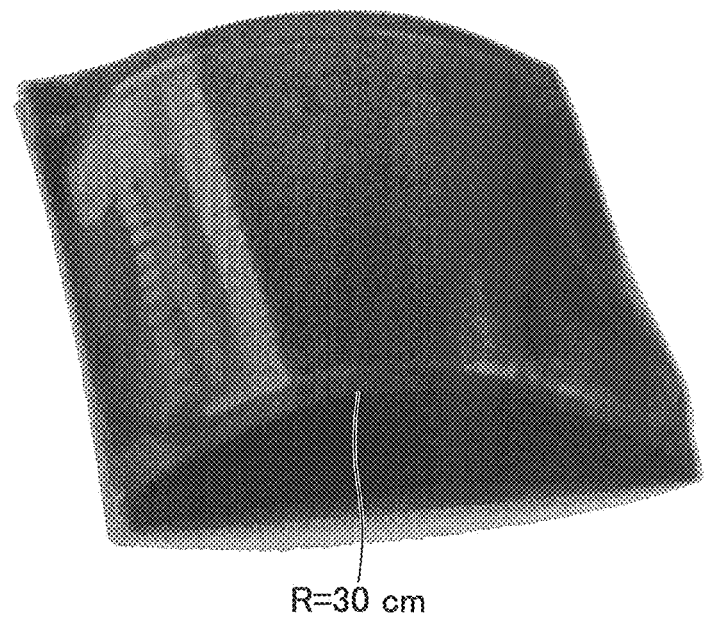
FIG. 9 is a photograph of the external view of a ferroelectric element fabricated by a comparison example 3.

In this case, after manufacturing the film, the sample (the metal substrate and the respective films formed on the metal substrate) was largely bent as illustrated in FIG. 9. The curvature radius in the bending direction was approximately R=30 cm. When the sample largely bends in this manner, the properties of the ferroelectric element will be degraded, and precise processes cannot executed when forming films on the ferroelectric element.

According to one embodiment of the present invention, a ferroelectric element having both flatness and favorable properties, and a method of manufacturing the ferroelectric element, are provided.

The ferroelectric element and the method of manufacturing a ferroelectric element are not limited to the specific embodiments described in the detailed description, and variations and modifications may be made without departing from the spirit and scope of the present invention.

For example, the second embodiment, and the modification examples 1 and 2 of the first embodiment may be combined.

What is claimed is:

1. A ferroelectric element comprising:
   a metal substrate;
   an insulating film formed on the metal substrate;
   a metal film formed on the insulating film;
   a seed film formed on the metal film;
   a ferroelectric film formed on the seed film, and
   an amorphous lead zirconate zirconium titanate film provided around the ferroelectric film, said ferroelectric film being formed by (i) applying precursor solution of lead zirconate zirconium titanate on the seed film and (ii) locally radiating laser at a particular portion of the metal substrate, thereby locally heating a portion of the amorphous lead zirconate zirconium titanate film to be crystallized and leaving an unheated portion of the amorphous lead zirconate zirconium titanate film amorphous,
   wherein the metal substrate includes iron (Fe) and nickel (Ni), and a content of the nickel (Ni) is greater than or equal to 30% and less than or equal to 40%, and
   wherein each of the metal substrate, the insulating film, metal film and the ferroelectric film has a plate-shape so as to extend in a direction parallel with the substrate.

2. The ferroelectric element according to claim 1, wherein a thermal expansion rate of the metal substrate at room temperature is less than or equal to $5 \times 10^{-6}$/K.

3. The ferroelectric element according to claim 1, wherein the metal substrate is a substrate including one or more metals of cobalt (Co), platinum (Pt), and palladium (Pd).

4. The ferroelectric element according to claim 1, wherein a surface roughness Rz of the metal substrate on a side having the ferroelectric film is less than or equal to 0.5 μm.

5. The ferroelectric element according to claim 1, wherein a thickness of the metal substrate is less than or equal to 100 μm.

6. The ferroelectric element according to claim 1, wherein the metal film is
   a metal film including one or more metals of platinum (Pt), palladium (Pd), iridium (Ir), titanium (Ti), and rhodium (Rh),
   a metal alloy film including an alloy of one or more of the metals, or
   a layered film formed by selecting any of the metal films or the metal alloy films and depositing a plurality of the selected films.

7. The ferroelectric element according to claim 1, wherein the metal film has a film thickness of greater than or equal to 100 nm and less than or equal to 500 nm.

8. The ferroelectric element according to claim 1, further comprising an upper electrode directly formed on the ferroelectric film.

9. The ferroelectric element according to claim 1, wherein the insulating film is formed directly on the metal substrate.

10. The ferroelectric element according to claim 1, wherein the metal film is formed directly on the insulating film.

11. The ferroelectric element according to claim 1, wherein the seed film is formed of $SrRuO_3$.

12. The ferroelectric element according to claim 1, wherein the ferroelectric element further comprises a second insulating film formed between the insulating film and the metal film.

13. The ferroelectric element according to claim 1, wherein the amorphous lead zirconate zirconium titanate film is formed by a synthesized PZT precursor solution having a composite oxide solid component concentration that is approximately less than or equal to 0.5 mole/liter.

14. The ferroelectric element according to claim 1, wherein the ferroelectric film is formed by repeating the steps (i) and (ii), thereby sequentially laminating the ferroelectric films having a film thickness of approximately 30 nm through 80 nm to form the ferroelectric film 14 having a desired film thickness.

* * * * *